(12) United States Patent
Kishimoto et al.

(10) Patent No.: US 9,484,200 B2
(45) Date of Patent: Nov. 1, 2016

(54) OXIDE SPUTTERING TARGET, THIN FILM TRANSISTOR USING THE SAME, AND METHOD FOR MANUFACTURING THIN FILM TRANSISTOR

(71) Applicant: Samsung Display Co., Ltd., Yongin, Gyeonggi-Do (KR)

(72) Inventors: Katsushi Kishimoto, Hwaseong-si (KR); Takayuki Fukasawa, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 121 days.

(21) Appl. No.: 14/049,422

(22) Filed: Oct. 9, 2013

(65) Prior Publication Data

US 2014/0353658 A1 Dec. 4, 2014

(30) Foreign Application Priority Data

May 30, 2013 (KR) ........................ 10-2013-0061990

(51) Int. Cl.
| | |
|---|---|
| H01L 21/00 | (2006.01) |
| H01L 29/78 | (2006.01) |
| H01L 21/02 | (2006.01) |
| H01L 29/786 | (2006.01) |
| H01L 29/66 | (2006.01) |
| C23C 14/34 | (2006.01) |

(52) U.S. Cl.
CPC ..... *H01L 21/02631* (2013.01); *C23C 14/3414* (2013.01); *H01L 21/02565* (2013.01); *H01L 29/66742* (2013.01); *H01L 29/66969* (2013.01); *H01L 29/7869* (2013.01); *H01L 29/78693* (2013.01)

(58) Field of Classification Search
CPC ..... H01L 21/00; H01L 21/16; H01L 21/479; H01L 29/7869; H01L 29/24
USPC .............................................. 438/104; 257/43
See application file for complete search history.

(56) References Cited

U.S. PATENT DOCUMENTS

| | | | |
|---|---|---|---|
| 7,768,042 B2 | 8/2010 | Park et al. | |
| 2008/0131735 A1* | 6/2008 | Das ....................... | C23C 14/025 428/831 |
| 2010/0193783 A1 | 8/2010 | Yamazaki et al. | |
| 2012/0037897 A1 | 2/2012 | Shiino et al. | |
| 2012/0256093 A1* | 10/2012 | Ueyama ................ | G01T 1/2018 250/366 |
| 2013/0015437 A1 | 1/2013 | Yamazaki | |
| 2013/0140557 A1* | 6/2013 | Miyairi ............. | H01L 29/78606 257/43 |

FOREIGN PATENT DOCUMENTS

| | | |
|---|---|---|
| JP | 2009-016844 A | 1/2009 |
| JP | 2010-248547 A | 11/2010 |
| JP | 4620046 B2 | 11/2010 |

(Continued)

*Primary Examiner* — Monica D Harrison
(74) *Attorney, Agent, or Firm* — Cantor Colburn LLP (57) ABSTRACT

A thin film transistor includes a gate electrode, a source electrode, a drain electrode disposed on the same layer as the source electrode and facing the source electrode, an oxide semiconductor layer disposed between the gate electrode and the source electrode or the drain electrode, and a gate insulating layer disposed between the gate electrode and the source electrode or the drain electrode, in which the oxide semiconductor layer includes thallium and at least one of indium, zinc, tin, and gallium. Also an oxide sputtering target including: an oxide including thallium (Tl); and at least one of indium, zinc, tin, and gallium.

13 Claims, 8 Drawing Sheets

(56) References Cited

FOREIGN PATENT DOCUMENTS

| | | |
|---|---|---|
| JP | 2011-091365 A | 5/2011 |
| JP | 2011-174134 A | 9/2011 |
| JP | 5095068 B2 | 9/2012 |
| KR | 1020100015073 A | 2/2010 |
| KR | 1020110111255 A | 10/2011 |
| KR | 1020120050565 A | 5/2012 |
| KR | 1020120080883 A | 7/2012 |
| KR | 1020120084966 A | 7/2012 |
| WO | 2005088726 A1 | 9/2005 |

* cited by examiner

OXIDE SPUTTERING TARGET, THIN FILM TRANSISTOR USING THE SAME, AND METHOD FOR MANUFACTURING THIN FILM TRANSISTOR

This application claims priority to and the benefit of Korean Patent Application No. 10-2013-0061990, filed on May 30, 2013, and all the benefits accruing therefrom under 35 U.S.C. §119, the entire content of which is incorporated herein by reference.

BACKGROUND (a) Technical Field

Disclosed is an oxide sputtering target, a thin film transistor using the same, and a method for manufacturing the thin film transistor.

(b) Description of the Related Art

Recently, thin film transistors have been used as switching and driving elements in a displays and in various other applications.

An amorphous silicon thin film transistor ("a-Si TFT") is a type of thin film transistor used for driving and switching elements of the display. The a-Si TFT can be uniformly formed on a large substrate at low cost and is widely used. However, because charge mobility in amorphous silicon is low, there is a limit in the manufacture of a high performance thin film transistor using amorphous silicon. Further, in the case where polysilicon is used, it is easier to manufacture a high performance thin film transistor because charge mobility is higher than in amorphous silicon, but there is a limit in manufacturing a large thin film transistor array panel when using polysilicon because the cost is of polysilicon is high and the uniformity of polysilicon is low.

Accordingly, a thin film transistor adopting an oxide semiconductor having electron mobility that is higher than that of amorphous silicon, an improved current ON/OFF ratio, a cost that is lower than that of poly silicon, and improved uniformity would be desirable.

SUMMARY

Provided is a novel oxide sputtering target, a thin film transistor wherein mobility is increased by using the same, and a method for manufacturing the thin film transistor.

An exemplary embodiment provides an oxide sputtering target including: an oxide including thallium (Tl), and at least one of indium, zinc, tin, and gallium.

The oxide may include thallium, zinc, and tin.

A content of thallium in the oxide may be 10 atomic percent (at %) or more.

An atomic number ratio of zinc to tin in the oxide may be 1 or more.

A content of thallium in the oxide may be 20 at % or more.

An atomic number ratio of zinc to tin in the oxide may be 2 or more.

A content of thallium in the oxide may be 30 at % or more.

An atomic number ratio of zinc to tin in the oxide may be 1 or more.

Another exemplary embodiment provides a thin film transistor including: a gate electrode; a source electrode; a drain electrode disposed on the same layer as the source electrode and facing the source electrode; an oxide semiconductor layer disposed between the gate electrode and the source electrode or the drain electrode; and a gate insulating layer disposed between the gate electrode and the source electrode or the drain electrode, in which the oxide semiconductor layer includes thallium and at least one of indium, zinc, tin, and gallium.

The oxide semiconductor layer may include thallium, zinc, and tin.

A content of thallium in the oxide semiconductor layer may be 30 at % or more.

The atomic number ratio of zinc to tin in the oxide semiconductor layer may be 1 or more.

A content of thallium in the oxide semiconductor layer may be 20 at % or more.

An atomic number ratio of zinc to tin in the oxide semiconductor layer may be 2 or more.

The gate electrode may be disposed under the oxide semiconductor layer, and the source electrode and the drain electrode may be disposed on the oxide semiconductor layer.

The thin film transistor may further include an etching prevention layer covering a channel portion of the oxide semiconductor layer and overlapping edges of lateral surfaces of the source electrode and the drain electrode, which face each other.

The thin film transistor may further include an insulating layer disposed on the source electrode and the drain electrode and covering an exposed upper surface of the etching prevention layer between the source electrode and the drain electrode.

Yet another exemplary embodiment provides a method for manufacturing a thin film transistor, the method including: forming a gate electrode on a substrate; forming a gate insulating layer on the gate electrode; sputtering a sputtering target comprising thallium and at least one of indium, zinc, tin, and gallium to form an oxide semiconductor layer on the substrate; forming a source electrode and a drain electrode facing each other on the oxide semiconductor layer; and forming a passivation layer on the source electrode and the drain electrode to manufacture the thin film transistor.

The oxide semiconductor layer may be formed using a sputtering target including thallium, zinc, and tin.

An atomic ratio of Tl to a total content of Zn and Sn may be 0.1 to 1.

According to an exemplary embodiment, it is possible to implement a thin film transistor wherein an effective mass is reduced and mobility is increased by forming a channel of the thin film transistor by using an oxide sputtering target including thallium where the effective mass is reduced and mobility is increased as compared to an effective mass and mobility of indium.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION OF THE EMBODIMENTS

Hereinafter, exemplary embodiments will be described in further detail with reference to the accompanying drawings. As those skilled in the art would realize, the described embodiments may be modified in various different ways, all without departing from the spirit or scope of the present disclosure. On the contrary, exemplary embodiments introduced herein are provided to make disclosed contents thorough and complete and will fully convey the scope of the invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An oxide sputtering target according to an exemplary embodiment comprises an oxide, the oxide comprising thallium (Tl). Thallium (Tl) is an element belonging to Group 3B of the periodic table, like indium (In). The novel oxide sputtering target including thallium, for example, TlSnZnO, is obtained by mixing powders of thallium oxide, zinc oxide, tin oxide, and gallium oxide in a water-soluble medium for several hours at a selected ratio, and forming a suspension solution. A binder, e.g., polyvinyl alcohol, and the like may be added to the suspension solution, which may be dried and baked in air at a temperature of 400° C. to 700° C., specifically 600° C. for several hours in order to remove the binder and provide a solid material. The solid material may be sintered in air or in an oxygen atmosphere at a temperature of 700° C. to 1200° C., specifically 1000° C. for several hours to form a target material, which may be in the form of a lump. While not wanting to be bound by theory, it is understood that because $Tl_2O_3$ (which has a melting point of about 700° C.) has a melting point that is lower than that of $In_2O_3$ (which has a melting point of 1910° C.), $Tl_2O_3$ may react at lower temperatures.

Also, it is believed that because thallium has a valence electron structure similar to that of indium ($6s^2$ $6p^1$ and $5s^2$ $5p^1$, respectively), a lattice structure of thallium is similar to that of indium, but an S orbital of thallium is larger than that of indium. Since thallium has a larger S orbital, an electron path is understood to be better formed.

In the oxide according to the present exemplary embodiment, the atomic content of thallium may be 10 atomic percent (at %) or more, specifically 10 at % to 60 at %, more specifically 15 at % to 50 at %, and the atomic number ratio of zinc to tin may be 1 or more, specifically 1 to 10, more specifically 2 to 8. An embodiment in which the atomic number ratio of zinc to tin is 1.5 is specifically mentioned. Also, an atomic ratio of Tl to a total content of Zn and Sn may be 0.1 to 1, specifically 0.2 to 0.7. Specific embodiments mentioned include those where the atomic ratio of Tl to total of Zn and Sn is 1:9, 2:8, 3:7, and 4:6.

In another exemplary embodiment, the content of thallium included in the oxide may be 30 at % or more, specifically 30 at % to 65 at %. Also, the atomic number ratio of zinc to tin may be 1 or more, specifically 1 to 10, more specifically 2 to 8. Further, an atomic ratio of Tl to a total content of Zn and Sn may be 0.1 to 1, specifically 0.2 to 0.7.

In another exemplary embodiment, the content of thallium included in the oxide may be 20 at % or more, specifically 20 at % to 65 at %. Also, the atomic number ratio of zinc to tin may be 2 or more, specifically 2 to 10, more specifically 3 to 8.

The oxide sputtering target according to the present exemplary embodiment may further include indium oxide.

In the thin film transistor according to the exemplary embodiment, a semiconductor layer may be formed by using the aforementioned oxide including thallium.

The highest values of mobilities of AlZnSnO ("AlZTO"), GaZnSnO ("GZTO"), and InZnSnO ("IZTO"), each of which are an oxide semiconductor including Zn, Sn, and a Group 3B element, in which Zn/Sn are present at a selected ratio (e.g., 1 or more, specifically 1 to 9, more specifically 3 to 6), are about 15 cm$^2$/Vs, 25 cm$^2$/Vs, and 32 cm$^2$/Vs, respectively. As is further described above, charge mobility is increased due to a difference between sizes of the S orbitals. The present exemplary embodiment is illustrated by expanding the aforementioned concept to thallium.

An effective mass may be calculated by calculating a band structure through an Ab-inito molecular orbital method with respect to the oxide semiconductor. In this case, assuming that a relationship between the effective mass and mobility is similar to the relationship in an amorphous material, electron mobility may be calculated from the calculated effective mass, as shown in Equations 1 and 2.

Equations 1 and 2.

---

Effective Mass, $m^* \propto 1/(\partial E2/\partial K2)$
Mobility, $\mu = C \times \tau/m^*$

---

E: Energy
K: Wave Number
μ: Mobility
C: Constant
τ: Relaxzation Time

An mobility of thallium (Tl) was estimated using an actual electron mobility of indium (In) by calculating the effective masses of indium (In) and thallium (Tl) according to the aforementioned method. Specifically, mobilities of InZnSnO ("IZTO") and TlSnZnO were measured. Herein, both indium (In) and thallium (Tl) were designed so that the atomic number ratios of zinc (Zn) and tin (Sn) were 1 or more. Further, since $C \times \tau$ of $\mu = C \times \tau/m^*$ is an integer depending on a crystalline structure, it is understood that $C \times \tau$ is the same integer in indium (In) and thallium (Tl) because they have similar crystalline structures.

Figure 1:
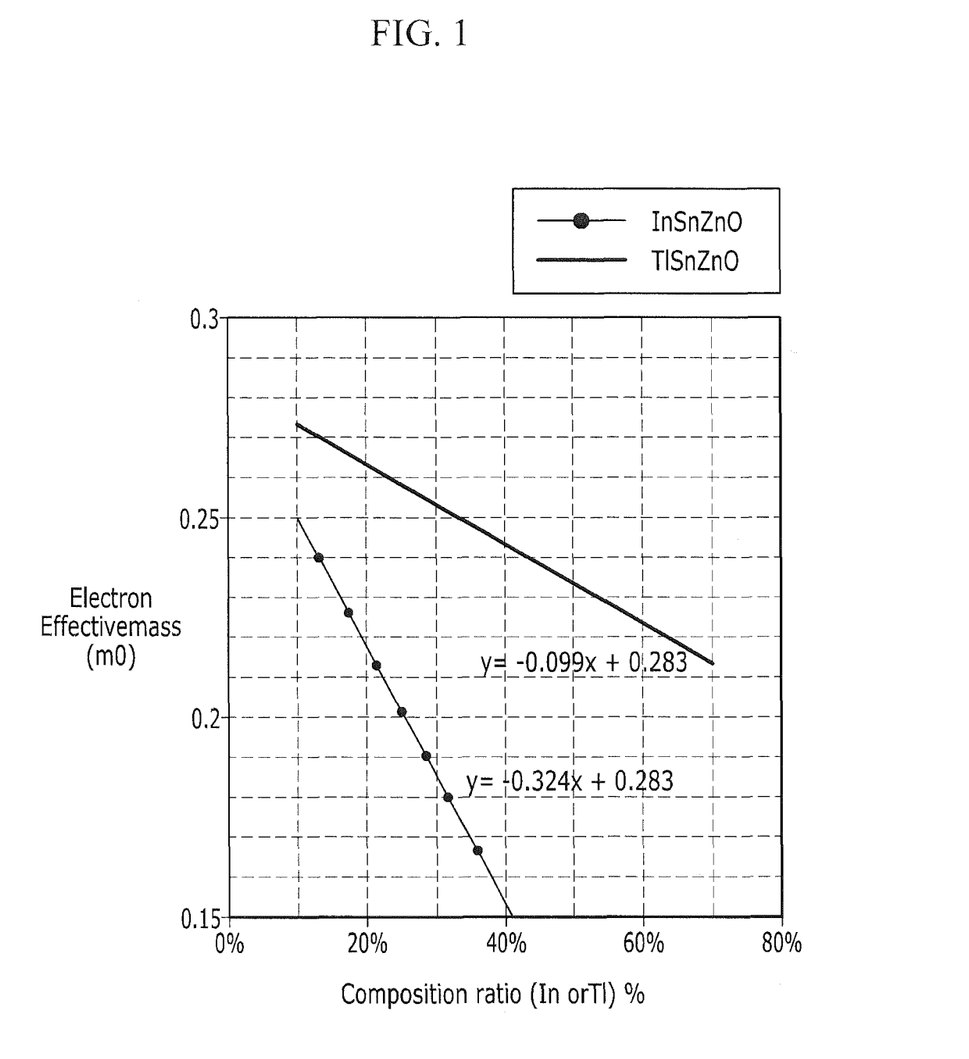
FIG. 1 is a graph of effective mass versus In or Tl atomic number ratio in an oxide thin film transistor including indium or thallium.

FIG. 1 is a graph illustrating the effective mass according to the atomic content in the oxide thin film transistor including indium or thallium. A composition ratio of indium (In) or thallium (Tl) in a horizontal axis of FIG. 1 represents the atomic number ratio of In or Tl in the oxide. Comparing slopes of the graph, an effect according to a reduction in effective mass when thallium is used is three times or more as compared to the effect when indium is used.

Figure 2:
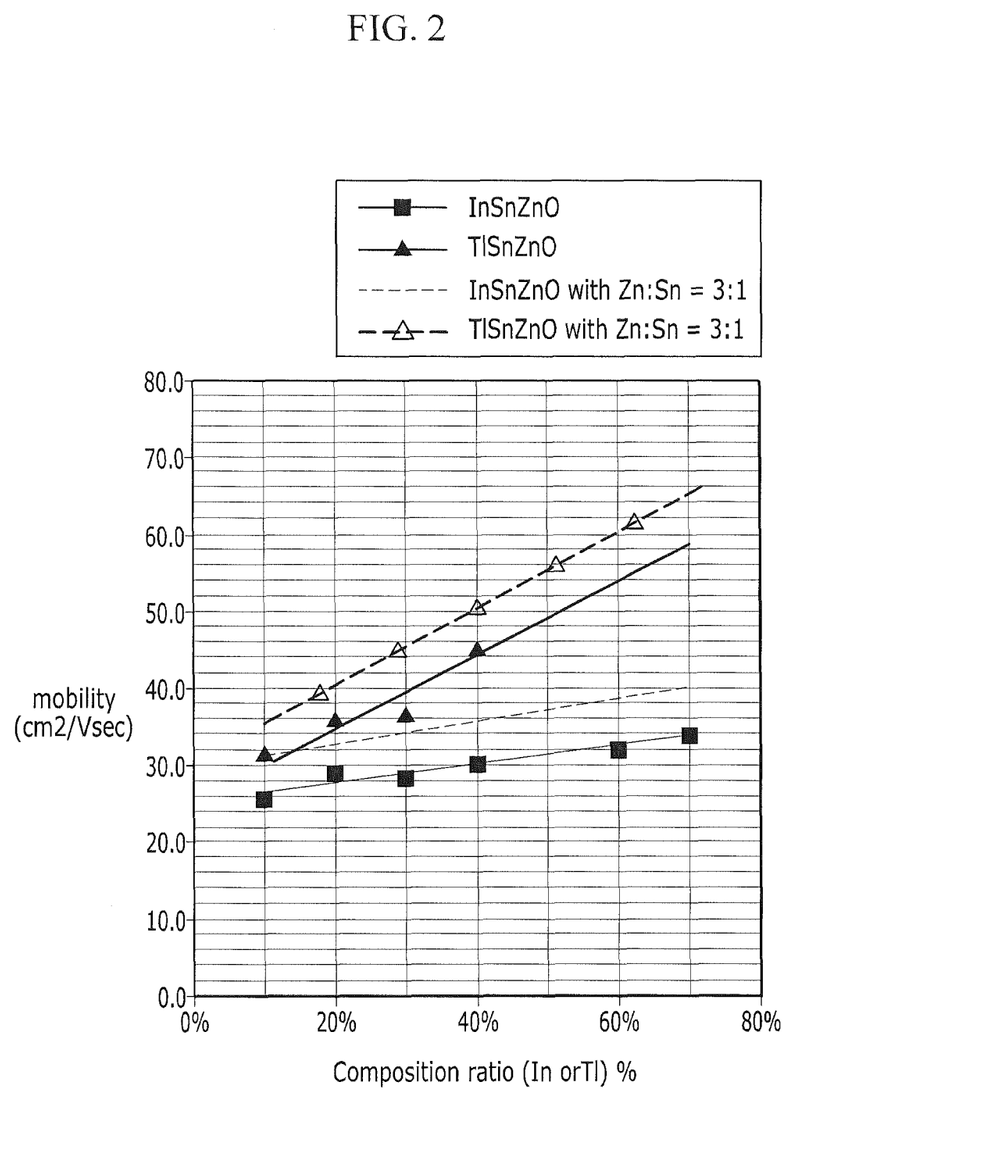
FIG. 2 is a graph illustrating electron mobility (square centimeters per volts-seconds) versus In or Tl atomic number ratio in the oxide thin film transistor including indium or thallium.

FIG. 2 is a graph illustrating electron mobility according to the In or Tl content in the oxide thin film transistor.

In the case where the content of indium (In) is 40 at % and the atomic number ratio of zinc (Zn) to tin (Sn) is 1 or more, mobility of 30 cm$^2$/Vs may be provided. In response to the aforementioned description, in the case of thallium (Tl), an electron mobility of 10 cm$^2$/Vs may be provided even though the content of thallium (Tl) is about 10 at % while ensuring the same condition where the atomic number ratio of zinc (Zn) to tin (Sn) is 1 or more, specifically 1 to 9.

Referring to FIG. 2, it can be seen that electron mobility is increased by about 5 cm$^2$/Vs in an experiment where the atomic ratio of zinc (Zn) to tin (Sn) is changed from 1 to 2. The calculated result obtained for when the ratio of zinc (Zn) to tin (Sn) is 3:1 in each of InSnZnO and TlSnZnO is illustrated as a dashed line in FIG. 2.

If a portion of FIG. 2 is analyzed, when the content of thallium is 30 at % and the ratio of zinc (Zn) to tin (Sn) is 1; and when the atomic content of thallium is 20 at % and the atomic ratio of zinc (Zn) to tin (Sn) is 2, mobility of 40 cm$^2$/Vs may be identically achieved. On the other hand, indium (In) has disadvantages in that the aforementioned mobility of 40 cm$^2$/Vs may be achieved only when the content of indium is 70 at % or more.

Figure 3:
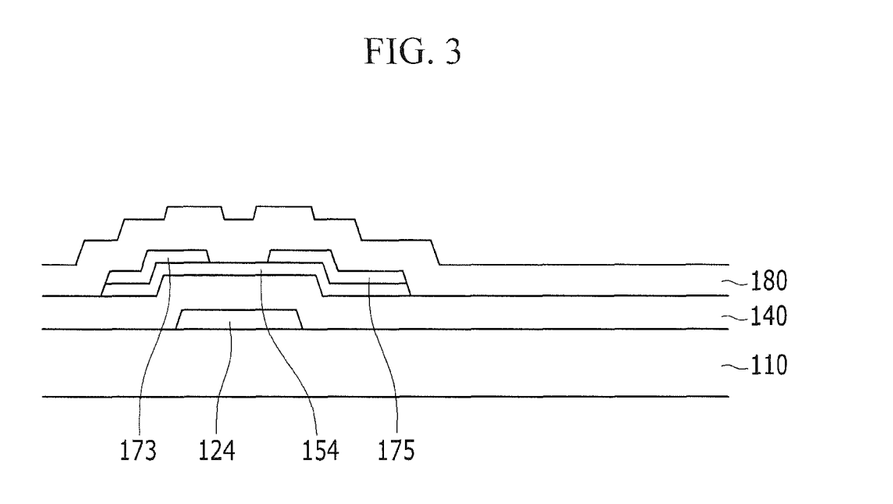
FIG. 3 is a cross-sectional view illustrating an embodiment of a thin film transistor.

FIG. 3 is a cross-sectional view illustrating the thin film transistor according to the exemplary embodiment.

A gate electrode 124 is disposed on a substrate 110. The substrate 110 may be an insulation substrate, and may include plastic, glass, or the like.

The gate line 124 may include an aluminum-based metal such as aluminum (Al) or an aluminum alloy, a silver-based metal such as silver (Ag) or a silver alloy, a copper-based metal such as copper (Cu) or a copper alloy such as copper manganese (CuMn), a molybdenum-based metal such as molybdenum (Mo) or a molybdenum alloy, chromium (Cr), tantalum (Ta), titanium (Ti), or the like. Alternatively, the gate electrode 124 may include a transparent conductive material such as indium tin oxide ("ITO"), indium zinc oxide ("IZO"), and aluminum doped ZnO ("AZO").

The present exemplary embodiment describes that the gate electrode 124 is formed of a single layer, but is not limited thereto, and the gate electrode 124 may be formed in any suitable number of layers, e.g., a dual or triple layer form.

In the case where the gate electrode has a dual-layer structure, the gate electrode 124 may be formed of a lower layer and an upper layer, and the lower layer may comprise any one selected from a molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy. The upper layer may comprise any one selected from an aluminum-based metal such as aluminum (Al) and an aluminum alloy, a silver-based metal such as silver (Ag) and a silver alloy, and a copper-based metal such as copper (Cu) and a copper alloy. In the case of the triple-layer structure, the triple layer structure may be formed by combination of layers having different physical properties.

A gate insulating layer 140 is disposed on the gate electrode 124. The gate insulating layer 140 may comprise silicon oxide, silicon nitride, silicon oxynitride (SiON), an organic insulating material, or the like. The gate insulating layer 140 may have a multilayer structure including two or more insulating layers (not illustrated). For example, an upper layer portion of the gate insulating layer 140 may be silicon oxide and the lower layer portion thereof may be silicon nitride, or the upper layer portion thereof may be silicon oxide and the lower layer portion thereof may be silicon oxynitride (SiON). In the case where the gate insulating layer 140 contacting an oxide semiconductor 154 includes the oxide, a degradation in a channel layer may be prevented.

The oxide semiconductor layer 154 may be disposed on the gate insulating layer 140.

The oxide semiconductor layer 154 according to the present exemplary embodiment may include the aforementioned thallium (Tl). The oxide semiconductor layer 154 may further include at least one of indium (In), zinc (Zn), tin (Sn), and gallium (Ga).

Further, herein, the oxide semiconductor layer 154 may be subjected to heat treatment in order to provide semiconducting properties. A heat treatment temperature may be 350° C. or more and 550° C. or less. If the heat treatment temperature is more than 550° C., an amorphous characteristic may be lost, and if the heat treatment temperature is less than 350° C., it may be difficult to provide suitable semiconducting properties.

In the oxide semiconductor layer 154 according to the present exemplary embodiment, the content of thallium may be 10 at % or more, and in this case, it is preferable that the atomic number ratio of zinc to tin be 1 or more, specifically 1 to 10, more specifically 2 to 8.

Unlike the aforementioned exemplary embodiment, the content of thallium included in the oxide semiconductor layer 154 may be designed to be 10 at % or more, specifically 30 at % or more. In this case, the atomic number ratio of zinc to tin may be 1 or more, specifically 1 to 10, more specifically 2 to 8.

Unlike the aforementioned exemplary embodiment, the content of thallium included in the oxide may be 20 at % or more. In this case, it is preferable that the atomic number ratio of zinc to tin be 2 or more, specifically 2 to 10.

In the present exemplary embodiment, the oxide semiconductor layer 154 may be formed by a sputtering method.

A source electrode 173 and a drain electrode 175 face each other on the oxide semiconductor layer 154 to expose a channel portion of the oxide semiconductor layer 154.

A passivation layer 180 is disposed on the source electrode 173 and the drain electrode 175 to cover the channel portion of the oxide semiconductor layer 154.

The passivation layer 180 may comprise silicon nitride, silicon oxide, or a combination thereof.

Figure 4:
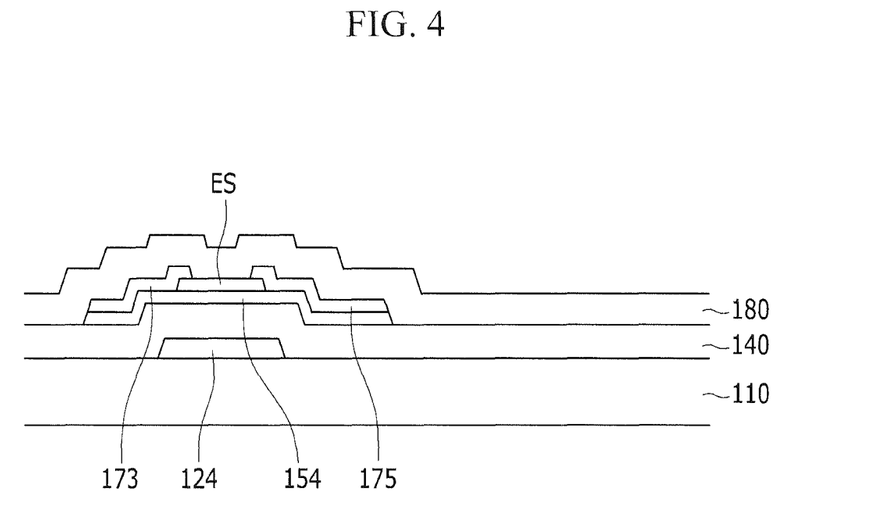
FIG. 4 is a cross-sectional view illustrating another embodiment of the thin film transistor.

FIG. 4 is a cross-sectional view illustrating the thin film transistor according to the exemplary embodiment.

Referring to FIG. 4, an etch stopper structure is illustrated, unlike the exemplary embodiment of FIG. 3. Specifically, the gate electrode 124 corresponding to a control electrode in the thin film transistor is disposed on the substrate 110, and the gate insulating layer 140 is disposed on the substrate 110 to cover the gate electrode 124.

An etching prevention layer 165 is disposed at a position corresponding to a channel region of the oxide semiconductor layer 154. The source electrode 173 and the drain electrode 175 are disposed on the semiconductor layer 154 while being spaced apart from each other so as to overlap an edge of the etching prevention layer 165. The etching prevention layer 165 may be partially exposed at a position at which the source electrode 173 and the drain electrode 175 are spaced apart from each other. The etching prevention layer 165 may comprise a silicon-based oxide, nitride, or oxynitride.

The passivation layer 180 is disposed on the source electrode 173 and the drain electrode 175. The passivation layer 180 is formed to fill a space in which the source electrode 173 and the drain electrode 175 are spaced apart from each other, and is formed to cover the etching prevention layer 165 exposed by the space in which the source electrode 173 and the drain electrode 175 are spaced apart from each other.

The content described in FIG. 3 in addition to the aforementioned difference may be mostly applied to the exemplary embodiment of FIG. 4.

Further, in the exemplary embodiments described in FIGS. 3 and 4, a bottom gate structure where the gate electrode is disposed at a lower portion of the semiconductor layer including the channel portion is described, but the present disclosure is not limited thereto, and can also be applied to a top gate structure where the gate electrode is disposed at an upper portion of the semiconductor layer.

FIGS. 5 to 8 are cross-sectional views illustrating a method for manufacturing the thin film transistor according to the exemplary embodiment.

Figure 5:
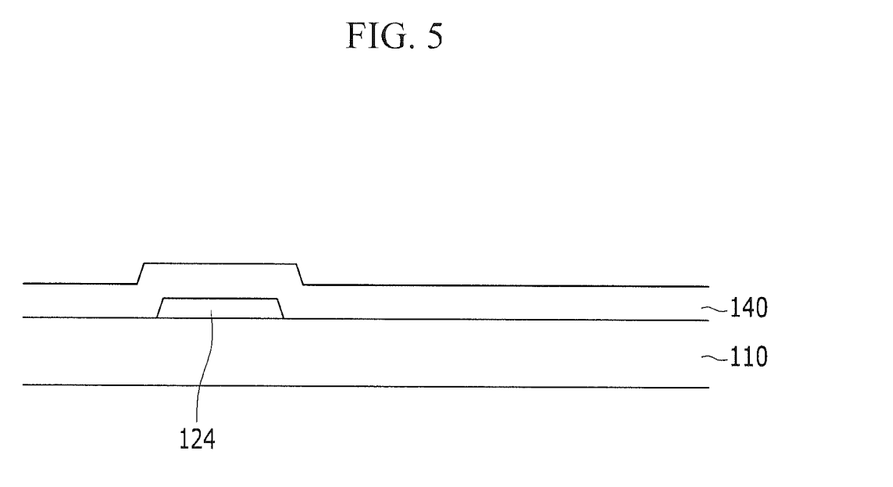
FIGS. 5 to 8 are cross-sectional views illustrating an embodiment of a method for manufacturing the thin film transistor.

Referring to FIG. 5, the gate insulating layer 140 is formed on the substrate 110 to cover the gate electrode 124. The gate insulating layer 140 may comprise silicon oxide, silicon nitride, or silicon oxynitride (SiON), and may be formed by a sputtering method and the like. Herein, the gate insulating layer 140 is described as a single layer form, but may be formed of silicon oxide, silicon nitride, or a double layer of silicon oxide and silicon oxynitride (SiON), for example. In this case, the layer formed of silicon oxide may be a layer adjacent to the semiconductor layer 154 to be described below.

Figure 6:
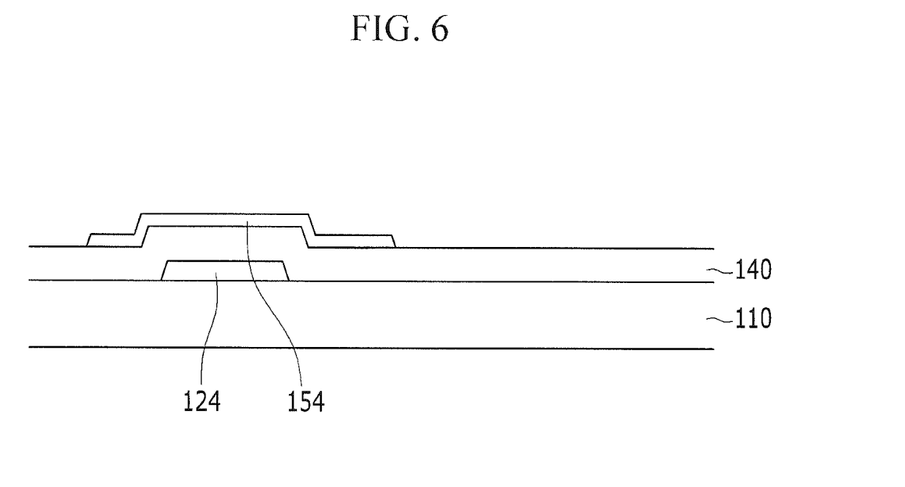

Referring to FIG. 6, a semiconductor material layer is formed on the gate insulating layer 140, and then patterned to form the semiconductor layer 154. The semiconductor layer 154 may be formed of the oxide semiconductor. In the present exemplary embodiment, the oxide semiconductor may include the aforementioned thallium (Tl). The oxide semiconductor layer 154 may further include at least one of indium (In), zinc (Zn), tin (Sn), and gallium (Ga).

In the present exemplary embodiment, when the semiconductor material layer is formed, the semiconductor material layer may be formed by a chemical vapor deposition method, a sputtering method, a pulse laser deposition method, an atomic layer deposition method, a spin coating method, inkjet printing, a roll-to-roll method, a nanoimprinting method, and the like. A sputtering method is specifically mentioned.

Figure 7:
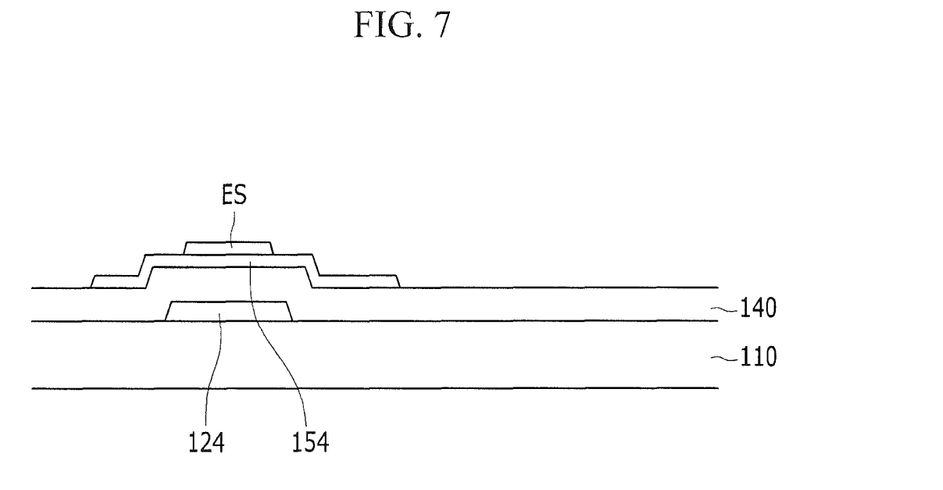

Referring to FIG. 7, an etching prevention layer ES is formed at a position corresponding to the channel region of the semiconductor layer 154. The etching prevention layer ES may comprise silicon-based oxide, nitride, or oxynitride. The etching prevention layer ES may serve to prevent silicon oxide (SiO2) or steam, which may occur in a subsequent process, from permeating the channel portion of the semiconductor layer 154.

Figure 8:
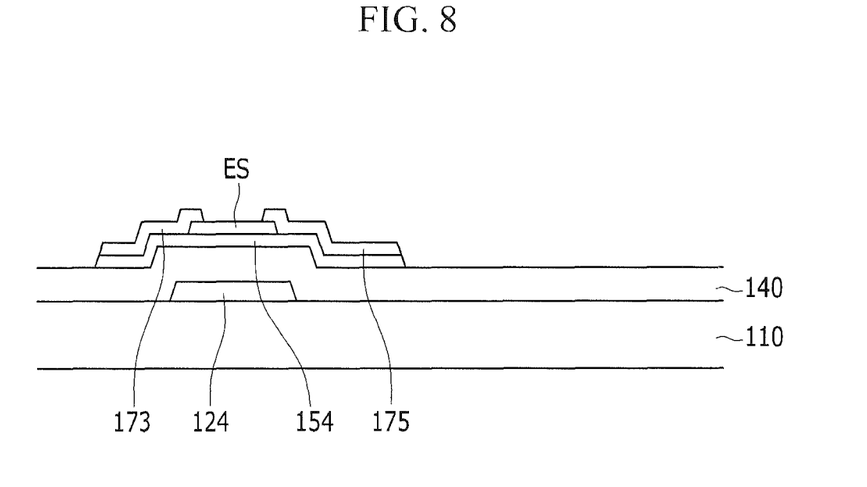

Referring to FIG. 8, the source electrode 173 and the drain electrode 175 are formed to overlap an edge of the etching prevention layer ES. The source electrode 173 and the drain electrode 175 face each other based on the gate electrode 124. The etching prevention layer ES may be partially exposed at a position at which the source electrode 173 and the drain electrode 175 are spaced apart from each other.

The source electrode 173 and the drain electrode 175 may comprise an aluminum-based metal such as aluminum or an aluminum alloy, a silver-based metal such as silver or a silver alloy, a copper-based metal such as copper or a copper alloy such as copper manganese, a molybdenum-based metal such as molybdenum or a molybdenum alloy, chromium, tantalum, and titanium. For example, there are Mo—Nb and Mo—Ti as the molybdenum alloy. Alternatively, the source electrode 173 and the drain electrode 175 may be made of a transparent conductive material such as ITO, IZO, and AZO. The source electrode 173 and the drain electrode 175 may have a multilayer structure including two or more conductive layers (not illustrated). For example, there are Mo/Al/Mo, Mo/Al, Mo/Cu, CuMn/Cu, Ti/Cu, and the like.

The passivation layer 180 is formed on the gate insulating layer 140 to cover an exposed surface of the etching prevention layer ES, and the source electrode 173 and the drain electrode 175. The passivation layer 180 may be formed of silicon oxide, silicon nitride, silicon oxynitride (SiON), an organic layer, or the like.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor comprising:
   a gate electrode;
   a source electrode;
   a drain electrode disposed at a same layer as the source electrode and facing the source electrode;
   an oxide semiconductor layer disposed between the gate electrode and the source electrode or the drain electrode; and
   a gate insulating layer disposed between the gate electrode and the source electrode or the drain electrode,
   wherein the oxide semiconductor layer comprises thallium and at least one of indium, zinc, tin, and gallium, and
   wherein a content of thallium in the oxide semiconductor layer is 10 atomic percent or more.

2. The thin film transistor of claim 1, wherein:
   the oxide semiconductor layer comprises thallium, zinc, and tin.

3. The thin film transistor of claim 2, wherein:
   a content of thallium in the oxide semiconductor layer is 30 atomic percent or more.

4. The thin film transistor of claim 3, wherein:
   the atomic number ratio of zinc to tin in the oxide semiconductor layer is 1 or more.

5. The thin film transistor of claim 2, wherein:
   a content of thallium in the oxide semiconductor layer is 20 atomic percent or more.

6. The thin film transistor of claim 5, wherein:
   the atomic number ratio of zinc to tin in the oxide semiconductor layer is 2 or more.

7. The thin film transistor of claim 1, wherein:
   the gate electrode is disposed under the oxide semiconductor layer, and the source electrode and the drain electrode are disposed on the oxide semiconductor layer.

8. The thin film transistor of claim 7, further comprising:
   an etching prevention layer covering a channel portion of the oxide semiconductor layer and overlapping edges of lateral surfaces of the source electrode and the drain electrode, which face each other.

9. The thin film transistor of claim 8, further comprising:
   an insulating layer disposed on the source electrode and the drain electrode and covering an exposed upper surface of the etching prevention layer between the source electrode and the drain electrode.

10. The thin film transistor of claim 1, wherein a content of the thallium in the oxide semiconductor is 10 atomic percent to 60 atomic percent.

11. A method for manufacturing a thin film transistor, the method comprising:
    forming a gate electrode on a substrate
    forming a gate insulating layer on the gate electrode;
    sputtering a sputtering target comprising thallium and at least one of indium, zinc, tin, and gallium to form an oxide semiconductor layer on the substrate wherein a content of the thallium in the oxide semiconductor is 10 atomic percent or more;
    forming a source electrode and a drain electrode facing each other on the oxide semiconductor layer; and
    forming a passivation layer on the source electrode and the drain electrode to manufacture the thin film transistor.

12. The method for manufacturing a thin film transistor of claim 11, wherein:
    the sputtering target comprises thallium, zinc, and tin.

13. The method for manufacturing a thin film transistor of claim 11, wherein a content of the thallium in the oxide semiconductor is 10 atomic percent to 60 atomic percent.

* * * * *